(12) United States Patent
Hori et al.

(10) Patent No.: US 6,215,163 B1
(45) Date of Patent: Apr. 10, 2001

(54) SEMICONDUCTOR DEVICE AND METHOD OF MANUFACTURING THE SAME WHERE THE NITROGEN CONCENTRATION IN AN OXYNITRIDE INSULATING LAYER IS VARIED

(75) Inventors: Mitsuaki Hori; Naoyoshi Tamura, both of Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 08/998,989

(22) Filed: Dec. 29, 1997

(30) Foreign Application Priority Data

Mar. 10, 1997 (JP) .................................. 9-055275

(51) Int. Cl.[7] ..................... H01L 29/784; H01L 21/336
(52) U.S. Cl. ................... 257/411; 257/344; 257/428; 257/336; 257/69; 257/347; 257/409; 257/66
(58) Field of Search .................... 257/411, 344, 257/408, 336, 305, 906, 347, 351, 429, 66, 49

(56) References Cited

U.S. PATENT DOCUMENTS

| | | | |
|---|---|---|---|
| 4,621,277 | * 11/1986 | Ito et al. ........................... 257/313 |
| 4,907,064 | * 3/1990 | Yamazaki et al. ................. 257/649 |
| 5,063,431 | * 11/1991 | Ohshima ........................... 257/316 |
| 5,254,506 | * 10/1993 | Hori .......................... 148/DIG. 114 |
| 5,258,333 | * 11/1993 | Shappir et al. . |
| 5,332,686 | * 7/1994 | Glenn ................................ 438/107 |
| 5,449,640 | * 9/1995 | Hunt et al. ......................... 438/640 |
| 5,541,436 | * 7/1996 | Kwong et al. ..................... 257/41 D |
| 5,563,093 | * 10/1996 | Koda et al. ........................ 438/231 |
| 5,620,910 | * 4/1997 | Teramoto .......................... 438/151 |
| 5,661,056 | * 8/1997 | Takeuchi .......................... 438/261 |
| 5,691,212 | * 11/1997 | Tsai et al. . |
| 5,726,087 | * 3/1998 | Tseng et al. ...................... 438/261 |
| 5,851,888 | * 12/1998 | Gardner et al. .................... 438/301 |
| 5,856,225 | * 1/1999 | Lee et al. ......................... 438/291 |
| 5,869,363 | * 2/1999 | Yamazaki et al. ................. 438/166 |
| 5,869,396 | * 2/1999 | Pan et al. .......................... 438/647 |
| 5,874,766 | * 2/1999 | Hori .................................. 257/411 |
| 5,880,040 | * 3/1999 | Sun et al. .......................... 438/769 |
| 5,918,125 | * 6/1999 | Guo et al. .......................... 438/264 |
| 5,930,621 | * 7/1999 | Kang et al. ........................ 438/253 |
| 5,939,763 | * 8/1999 | Hao et al. ......................... 257/411 |
| 5,972,783 | * 10/1999 | Arai et al. ......................... 438/513 |

FOREIGN PATENT DOCUMENTS 5-211330   8/1993   (JP) .

* cited by examiner

*Primary Examiner*—Alexander O. Williams
(74) *Attorney, Agent, or Firm*—Armstrong, Westerman, Hattori, McLeland & Naughton, LLP

(57) ABSTRACT

A semiconductor device of the present invention comprises a gate insulating layer made of a oxynitride formed on a semiconductor substrate, a gate electrode formed on the gate insulating layer, source/drain regions formed in the semiconductor substrate on both sides of the gate electrode and including impurity, and a oxynitride insulating layer covering the source/drain regions on a surface of the semiconductor substrate and having nitrogen concentration distribution which is different from that of the gate insulating layer along a film thickness direction.

8 Claims, 9 Drawing Sheets

(950°C, O₂)

(750°C or 800°C or 850°C, NH₃)

(NH₃ → N₂)

(900°C, N₂O)

FURNACE: 950°C, 5.84 nm SiO$_2$ (INITIAL)
800°C NH$_3$ 60s + 900°C N$_2$O 60s
n=1.46 : 5.84 nm (RESULT)

FURNACE: 950°C, 5.49 nm SiO$_2$ (INITIAL)
850°C NH$_3$ 60s + 900°C N$_2$O 60s
n=1.46: 5.96 nm (RESULT)

SEMICONDUCTOR DEVICE AND METHOD OF MANUFACTURING THE SAME WHERE THE NITROGEN CONCENTRATION IN AN OXYNITRIDE INSULATING LAYER IS VARIED

BACKGROUND OF THE INVENTION

1. Field of the Invention

The present invention relates to a semiconductor device and a method of manufacturing the same and, more particularly, a semiconductor device having an MIS (metal insulator semiconductor) type field effect transistor and a method of manufacturing the same.

2. Description of the Prior Art

According to the recent miniaturization and high integration of the semiconductor device, thin film formation of a gate insulating layer has been accelerated. According to this tendency, reduction in a hot carrier resistance of the semiconductor device and a punch-through phenomenon of the impurity included in gate electrode constituting material to the substrate of the field effect transistor have become issues.

In general, a MIS field effect transistor, e.g., PMOS transistor is formed through manufacturing steps shown in FIGS. 1A to 1D.

At first, as shown in FIG. 1A, a field oxide layer (local oxidation of silicon:LOCOS) 102 is formed by selectively oxidizing a surface of a device isolating region of a silicon substrate 101. An n-type well 103 is then formed by introducing n-type impurity into a device forming region surrounded by LOCOS 102. An insulating layer 104 formed of $SiO_2$ is formed by thermally oxidizing the device forming region on the surface of the silicon substrate 101.

Next, a polysilicon layer is formed on the insulating layer 104 and the field oxide layer 102. As shown in FIG. 1B, a gate electrode 105 is then formed by patterning the polysilicon layer by virtue of a photolithography technique.

Thereafter, a p-type impurity such as boron is introduced into the gate electrode 105 and the silicon substrate 1, so that conductivity of the gate electrode 105 can be made higher and impurity diffusion layers 106s, 106d of low impurity concentration are formed on both sides of the gate electrode 105.

Subsequently, as shown in FIG. 1C, dielectric side walls 107 are formed on side surfaces of the gate electrode 105. With the use of the gate electrode 105 and the side walls 107 as a mask, impurity diffusion layers 108s, 108d of high impurity concentration are then formed on both sides of the gate electrode 105. A source region 109s and a drain region 109d are formed to have a LDD (lightly doped drain) structure by the impurity diffusion layers 108s, 108d of high impurity concentration and the impurity diffusion layers 106s, 106d of low impurity concentration.

By the way, a thin silicon oxide layer is employed as material of the insulating layer 104 formed beneath the gate electrode 105. However, as shown in FIGS. 1B and 1D, if borons are ion-implanted as impurity into the silicon substrate 101, the impurity has punched through the gate electrode 105 and the insulating film 104 to thus lower n-type impurity concentration in the surface layer of the n-type well 103. As a result, a pn junction composed of the p-type impurity diffusion layers 106s, 106d of low concentration and the n-type well 103 occurs in an area substantially deeper than the surface of the substrate.

On the contrary, in the MOS transistor, further improvement of the hot carrier resistance of an insulating film formed on the surface of the substrate has been requested with the progress of miniaturization.

Under these circumstances, it has been reported that, with the use of a silicon oxynitride (SiON) layer as the insulating layer beneath the gate electrode, punch-through of boron ions to the semiconductor substrate beneath the gate electrode can be prevented by the silicon oxynitride layer. In addition, it has been reported that hot carrier resistance can be improved by forming a silicon oxynitride layer on source/drain regions of the semiconductor substrate.

In order to achieve two major objects of employing the silicon oxynitride layer simultaneously, the silicon oxynitride layer which is formed on a principal surface of the semiconductor substrate as the gate insulating layer has been used as it is as a covering film on the source/drain regions.

If the silicon oxynitride layer is formed on the drain region as the covering film, drain avalanche hot carrier resistance can be improved rather than the case where a thermally oxidizing silicon layer is formed as the covering film. Besides, if such effect would be enhanced, nitrogen concentration in the silicon oxynitride layer should be made higher.

If nitrogen is excessively included in the insulating layer beneath the gate electrode, the number of trapped hole or electron becomes large and also channel hot hole resistance or channel hot electron resistance is degraded.

If nitrogen is excessively included in the oxide film beneath the gate electrode, a threshold voltage in the transistor parameters is largely shifted to the negative direction rather than the case where no nitrogen is included.

Regarding such problem, it has been set forth in Patent Application Publication (KOKAI) 5-211330, for example, that, if nitrogen concentration of the silicon oxynitride layer in the source/drain regions of the field effect transistor is made higher than that of the silicon oxynitride layer beneath the gate electrode, hot carrier resistance can be improved and also a current driving factor can be enhanced by a low gate voltage.

However, unless nitrogen concentration in the insulating film formed immediately beneath the gate electrode is sufficiently high, punch-through of boron ions in the gate electrode and the insulating layer cannot be prevented. Therefore, it is not preferable that nitrogen concentration in the silicon oxynitride layer constituting the gate insulating layer is set lower than nitrogen concentration in the silicon oxynitride layer in the source/drain regions.

As stated above, in the MIS transistor technology in the prior art, there exists no structure which is able simultaneously to prevent the punch-through from the gate electrode to the silicon substrate, reduce a shift amount of the threshold voltage, improve the avalanche hot carrier resistance in the source/drain regions, and prevent degradation of the transistor parameters.

SUMMARY OF THE INVENTION

It is an object of the present invention to provide a semiconductor device having a MIS transistor which is capable of enhancing hot carrier resistance, preventing punch-through of impurity ions from a gate insulating layer, enhancing avalanche hot carrier resistance in source/drain regions, reducing variation in a threshold value of a transistor driving voltage, and improving transistor parameters, and a method of manufacturing the same.

According to the present invention, nitrogen concentration distribution along a film thickness direction in a first oxynitride layer employed as a gate insulating layer between a semiconductor substrate and a gate electrode of a MIS transistor is set differently from nitrogen concentration distribution along a film thickness direction in a second oxynitride layer serving as an insulating layer interposed between the gate electrode and source/drain regions.

The inventors of the present invention have found that a shift amount of threshold value, prevention of punch-through of impurity ions, and hot carrier resistance of the MIS transistor respectively depend greatly on nitrogen concentration and nitrogen concentration distribution in an interface between the silicon substrate and the gate insulating layer and that introduction of a large amount of nitrogen causes largely variation of transistor parameters throughout lots. In addition, it has been confirmed by the experiment that an optimum insulating film to improve MIS transistor parameters by adjusting distribution of the nitrogen concentration along the film thickness direction is present.

For instance, as a first oxynitride layer, there is a layer in which the nitride concentration distribution is gradually changed along the film thickness direction or in which nitrogen is segregated in an interface between the first oxynitride layer and the gate electrode. In addition, as a second oxynitride layer, there is a layer in which nitrogen is segregated in an interface between the second oxynitride layer and the semiconductor substrate. An event "the nitrogen concentration is gradually changed" indicates that nitrogen concentration in the vicinity of the interface between the first oxynitride layer and the semiconductor substrate has a distribution which is not so changed in the film thickness direction.

Thereby, according to the nitrogen concentration distribution in the first oxynitride layer, impurity becomes difficult to punch through upon ion implantation of impurity, carrier trap can be made less, and hot carrier resistance can be improved according to the nitrogen concentration distribution in the second silicon nitride layer.

In order to improve the hot carrier resistance, it is preferable that nitrogen containing amount in the insulating film between the gate electrode and the source/drain regions is increased.

Moreover, the nitrogen concentration distribution in the gate insulating layer may be changed gradually and simultaneously the silicon oxide layer may be employed as the insulating layer covering the source/drain regions. According to this, deterioration in a breakdown voltage on peripheral portions of the gate electrode can be prevented by the silicon insulating layer and in addition a stable film thickness can be obtained. Therefore, depths of shallow impurity diffusion layers in the source/drain regions having an LDD structure can be stabilized.

Not only single element semiconductor such as silicon, germanium, etc. but also compound semiconductor may be included in materials for the substrate of the MIS transistor.

Other and further objects and features of the present invention will become obvious upon an understanding of the illustrative embodiments about to be explained in connection with the accompanying drawings or will be indicated in the appended claims, and various advantages not referred to herein will occur to one skilled in the art upon employing of the invent in practice.

DESCRIPTION OF THE PREFERRED EMBODIMENTS

Figure 1A:
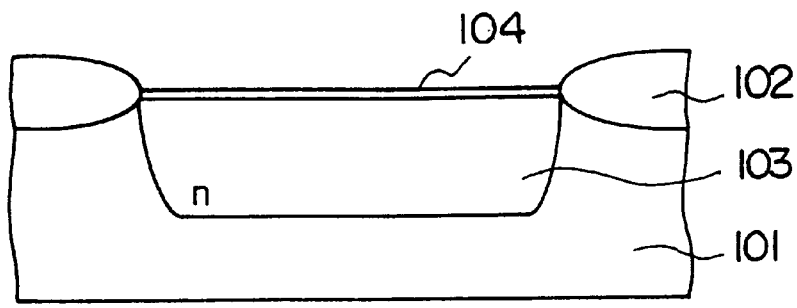
FIGS. 1A to 1D are sectional views showing steps of manufacturing a normal MOS transistor in the prior art.
Figure 1B:
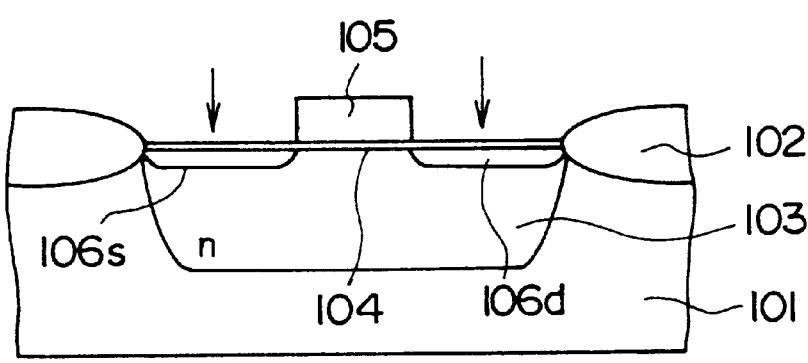
Figure 1C:
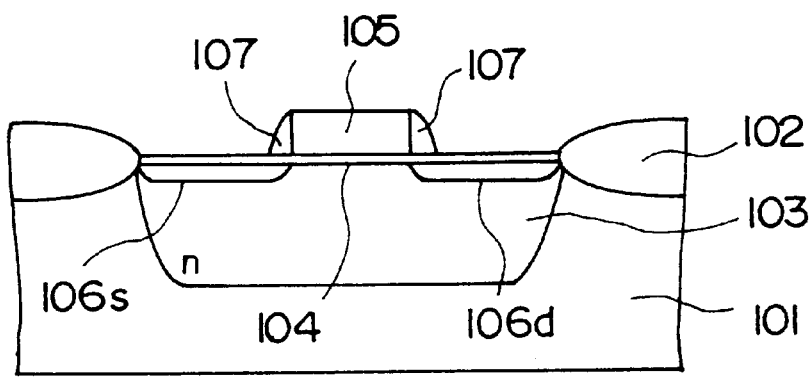
Figure 1D:
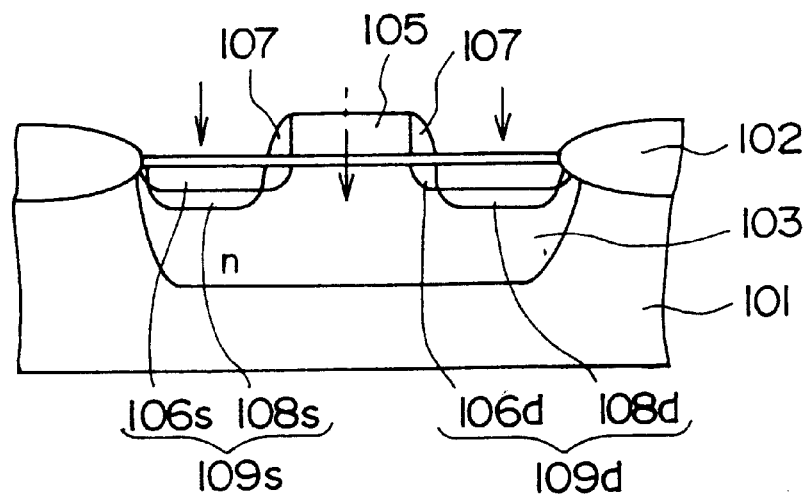

Various embodiments of the present invention will be explained with reference to the accompanying drawings. It should be noted that the same or similar reference numerals are applied to the same or similar parts and elements throughout the drawings, and the explanation of the same or similar parts and elements will be omitted or simplified.

At first, steps of manufacturing a MOS transistor which does not employ an LDD structure in source/drain regions will be explained as a first example, and steps of manufacturing a MOS transistor which has the source/drain regions having the LDD structure will be explained as a second example.

First Example

FIGS. 2A to 2D are sectional views showing steps of manufacturing the MOS transistor having the source/drain regions which does not employ the LDD structure.

Figure 2A:
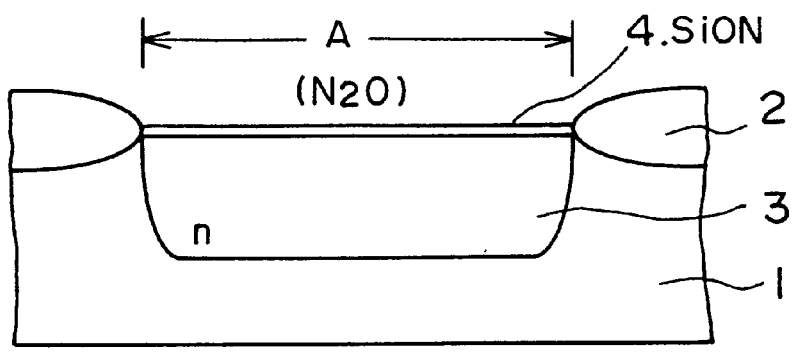
FIGS. 2A to 2D are sectional views showing first steps of manufacturing the MOS transistor in the embodiment of the present invention.

First, manufacturing steps until the MOS transistor shown in FIG. 2A can be obtained will be explained hereunder.

A field oxide layer 2 is formed on a silicon (semiconductor) substrate 1 by selective oxidation to have a thickness of 250 nm. A region surrounded by the field oxide layer 2 constitutes a device forming region An n-type impurity such as phosphorus, arsenic, or the like is introduced into the device forming region A by using the field oxide layer 2 as a mask. Thus, an N-type well is formed in the device forming region A on the silicon substrate 1.

The silicon substrate 1 is put into a vertical diffusion furnace (not shown), and then a surface of the silicon substrate 1 is exposed to oxynitride ($N_2O$) gas atmosphere at 950° C. in the furnace. Thus, a first silicon oxynitride layer 4 of 6 nm thickness is formed in the device forming region A on the surface of the silicon substrate 1.

A polysilicon layer of 180 nm thickness is then grown on the first silicon oxynitride layer 4 and the field oxide layer 2 on the silicon substrate 1 by CVD. Subsequently, a gate electrode 5 which passes through a central portion of the device forming region A is formed by patterning the polysilicon layer by virtue of photolithography. Source/drain regions are formed in regions of the device forming region A located on both sides of the gate electrode 5 according to later described steps.

The silicon substrate 1 is then loaded into the chamber of a rapid thermal annealing apparatus (not shown), and an atmosphere including an ammonia ($NH_3$) gas at 850° C. is then created in the chamber. The silicon substrate 1 is then exposed to the atmosphere for 60 seconds, and the gas in the chamber is then replaced with nitrogen ($N_2$).

Figure 2B:
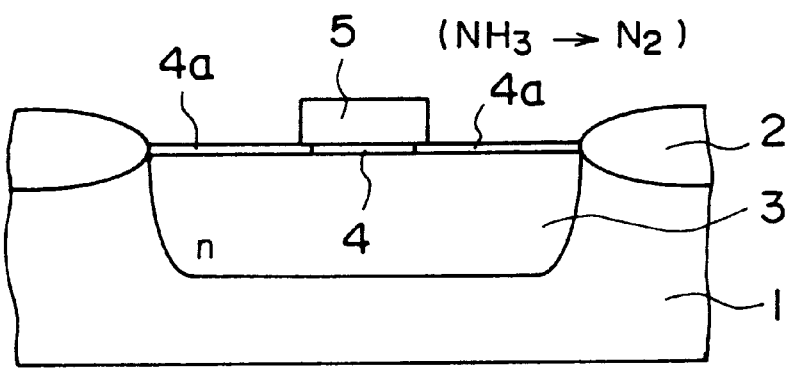

As shown in FIG. 2B, nitrogen concentration in the first silicon oxynitride layer 4 is made higher on both sides of the gate electrode 5 by the $NH_3$ gas. Such high nitrogen concentration portions serve as second silicon oxynitride layers 4a.

The nitrogen gas in the chamber is then replaced with an $N_2O$ gas. A temperature of the interior of the chamber is then increased up to 900° C. and, as shown in FIG. 2C, the silicon substrate 1 is then held in the atmosphere for 60 seconds.

According to the steps carried out until now, by changing the temperature of the $NH_3$ atmosphere and the processing time, nitrogen concentration in the second silicon oxynitride layer 4a on both sides of the gate electrode 5 can be controlled and in addition nitrogen concentration in an interface area between the second silicon oxynitride layer 4a and the silicon substrate 1 can be locally controlled. This is because a bond between nitrogen and silicon in the interface is readily caused.

In other words, peaks of nitrogen concentration in the second silicon oxynitride layer 4a located on both sides of the gate electrode 5 and the silicon substrate 1 can be controlled to exist near the interface area between the second silicon oxynitride layer 4a and the silicon substrate 1. Accordingly, nitrogen concentration distribution in the second silicon oxynitride layer 4a along a film thickness direction located on both sides of the gate electrode 5 is made different from that in the first silicon oxynitride layer (gate insulating layer) 4 located directly beneath the gate electrode 5.

Figure 2C:
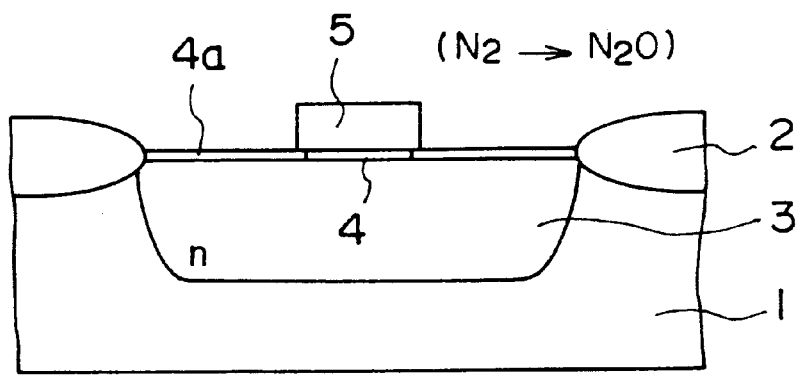
Figure 2D:
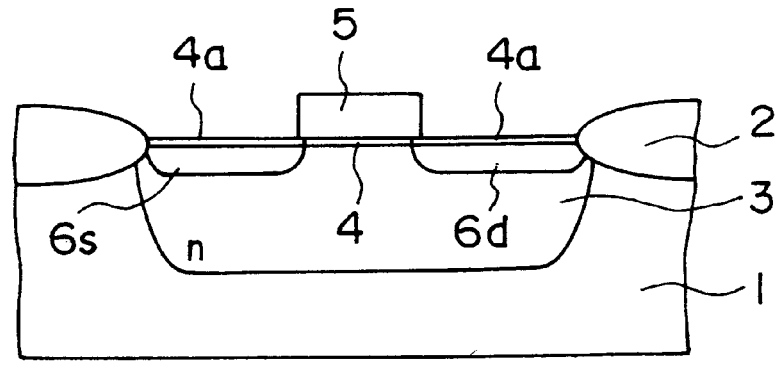

As shown in FIG. 2C, the second oxynitride process after replacement of the $NH_3$ gas with $N_2O$ is conducted in order to remove mainly hydrogen atoms which are introduced into the second oxynitride silicon layer 4a in the $NH_3$ gas atmosphere.

In turn, with the use of the gate electrode 5 and the field oxide layer 2 as a mask, a p-type impurity such as boron is introduced into the silicon substrate 1 on both sides of the gate electrode 5 to thus form a source region 6s and a drain region 6d. End portions of two impurity diffusion layers 6s, 6d are covered with the second silicon oxynitride layers 4a which extend to peripheral portions beneath the gate electrode 5.

An interlayer insulating layer is then formed though not shown particularly, then contact holes are formed in the interlayer insulating layer, and then wirings formed on the interlayer insulating layer are connected to the source region 6s, the drain region 6d, and the gate electrode 5 via the contact holes.

Second Example Next, steps of manufacturing a MOS transistor which employs impurity diffusion layers having the LDD structure as the source/drain regions will be explained hereunder.

Figure 3A:
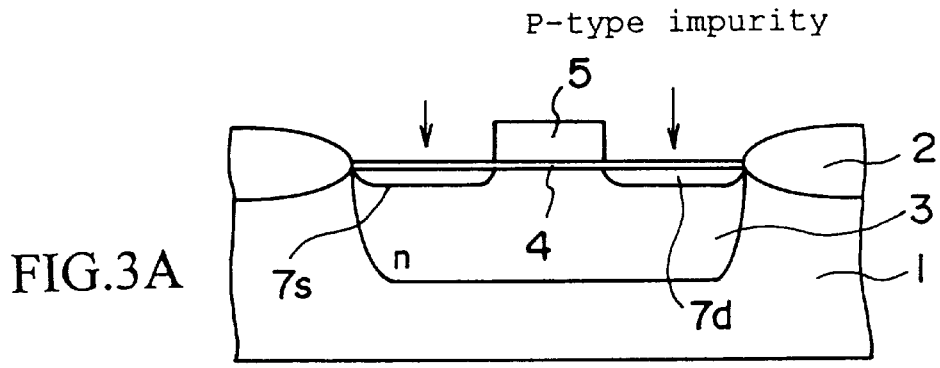
FIGS. 3A to 3D are sectional views showing second steps of manufacturing the MOS transistor in the embodiment of the present invention.

First, like the first example, the first silicon oxynitride layer 4 is formed on the surface of the device forming region A on the silicon substrate 1, and the gate electrode 5 is then formed in the device forming region A on the silicon substrate 1. Thereafter, as shown in FIG. 3A, a p-type impurity is introduced into the silicon substrate 1 with the use of the gate electrode 5 and the field oxide layer 2 as a mask to thus form shallow impurity diffusion layers 7s, 7d of low impurity concentration.

Figure 3B:
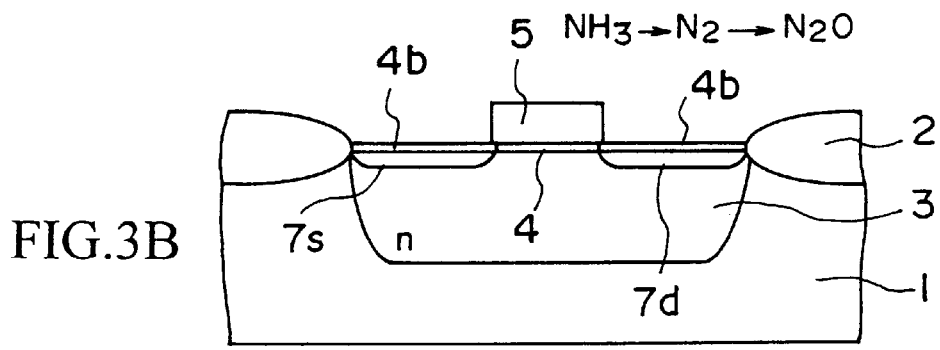

As shown in FIG. 3B, under the same conditions as those in the first example, nitrogen is introduced into a part of the first silicon oxynitride layer 4 located on both sides of the gate electrode 5 while changing the ambient atmosphere of the first silicon oxynitride layer 4 to $NH_3$, $N_2$, and $N_2O$ sequentially such that a peak of nitrogen is present near the interface between the first silicon oxynitride layer 4 and the impurity diffusion layers (silicon substrate) 7s, 7d of low impurity concentration. Such nitrogen enhancing regions of the first silicon oxynitride layer 4 serve as second silicon oxynitride layers 4b. The second silicon oxynitride layers 4b are formed to extend to peripheral portions beneath the gate electrode 5. Thus, end portions of the impurity diffusion layers 7s, 7d of low impurity concentration are covered with the second silicon oxynitride layers 4b.

Accordingly, nitrogen concentration distribution in the second silicon oxynitride layer 4b located on both sides of the gate electrode 5 becomes different from that in the first silicon oxynitride layer (gate insulating layer) 4 formed immediately beneath the gate electrode 5.

Subsequently, an $SiO_2$ layer is grown on an overall surface by CVD so that the gate electrode 5 and the silicon substrate 1 are covered with the $SiO_2$ layer.

Figure 3C:
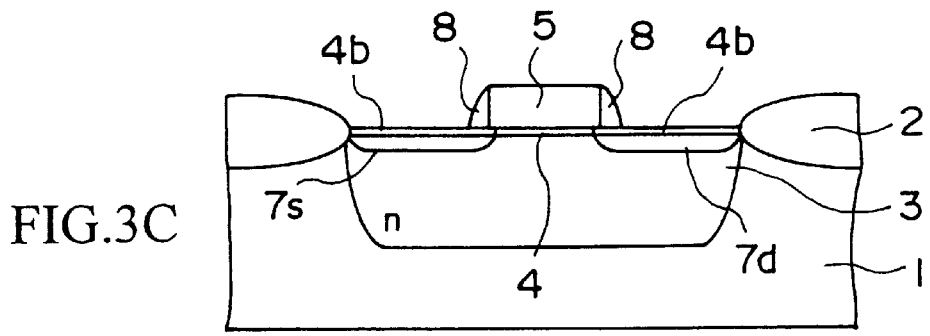

The $SiO_2$ layer is then vertically etched by reactive ion etching such that, as shown in FIG. 3C, the $SiO_2$ layers remain on both sides of the gate electrode 5 as dielectric side walls 8.

Figure 3D:
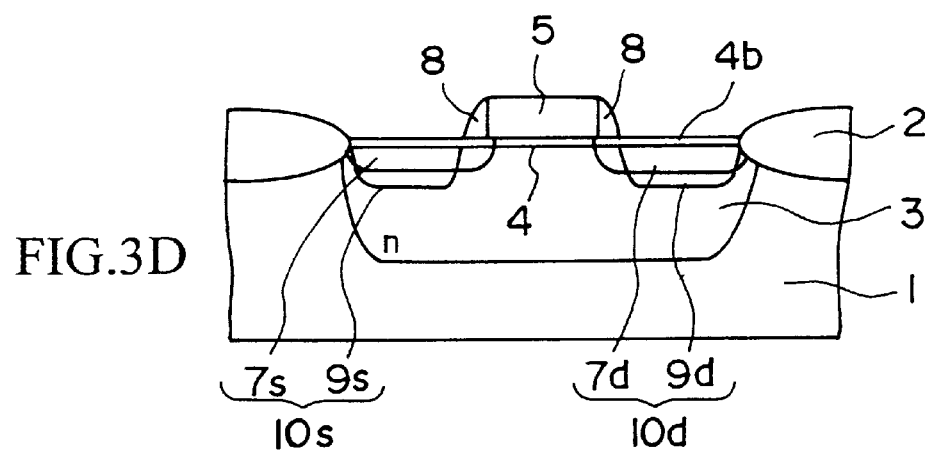

As shown in FIG. 3D, a p-type impurity is introduced into the silicon substrate 1 by use of the gate electrode 5 and the side walls 8 as a mask. As a result, deep impurity diffusion layers 9s, 9d of high impurity concentration are formed in the silicon substrate 1 outside of the gate electrode 5 and the side walls 8. The source region 10s and the drain region 10d each having the LDD structure are formed by the impurity diffusion layers 9s, 9d high impurity concentration and the impurity diffusion layers 7s, 7d of low impurity concentration.

An interlayer insulating layer is then formed though not shown, then contact holes are opened in the interlayer insulating layer, and then wirings formed on the interlayer insulating layer are connected to the source region 10s, the drain region 10d, and the gate electrode 5 via the contact holes.

The manufacturing steps not to remove the first oxynitride silicon layers 4 located on both sides of the gate electrode 5 have been explained in the above first and second embodiments. However, after the gate electrode 5 is formed, the first silicon oxynitride layers 4 located on both sides of the gate electrode 5 may be removed and the first silicon oxynitride layers 4 may then be grown once again on the surface of the silicon substrate 1.

In the above examples, in order to provide the peak of nitrogen concentration in the interface between the silicon substrate and the silicon oxynitride layer, such a method is adopted that the silicon oxynitride layer is exposed to the $NH_3$ gas atmosphere in the furnace of the rapid thermal annealing apparatus, then the $NH_3$ gas is replaced with the $N_2$ gas, and then the silicon oxynitride layer is exposed to the $N_2O$ gas.

However, other methods may be employed. For the purpose of example, a method of processing in the $N_2O$ gas atmosphere in the rapid thermal annealing apparatus, a method of processing in the NO gas atmosphere, etc. may be employed. In this case, the vertical diffusion furnace may be employed in place of the rapid thermal annealing apparatus.

Although two methods of manufacturing the MOS transistors have been explained in the above, these manufacturing steps are different from the prior art in that nitrogen distribution is made different in the first silicon oxynitride layer 4 constituting the gate insulating layer and the second silicon oxynitride layers 4a, 4b for covering the source/drain regions.

Therefore, nitrogen distribution in the above-mentioned first silicon cxynitride layer 4 and the second silicon oxynitride layers 4a, 4b will be explained hereunder. (i) First, as in the FIG. 2A, the first silicon oxynitride layer is formed on the silicon substrate by the vertical diffusion furnace in the $N_2O$ containing atmosphere at 950° C. to have a thickness of 6 nm. Then, according to the SIMS (Secondary Ion Mass Spectrometry) analysis, analysis results shown in FIG. 4 have been derived. It has been deduced that the nitrogen concentration distribution gradually changes in this silicon oxynitride layer.

Figure 4:
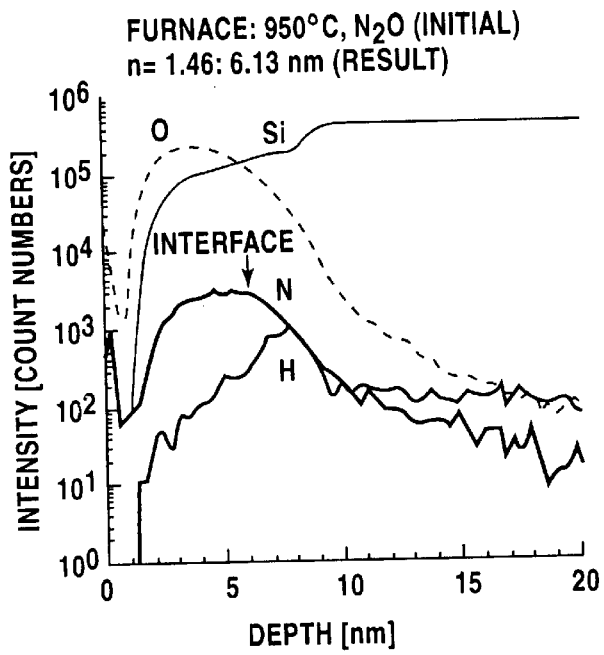
FIG. 4 is a graph showing concentration distribution of constituent elements included in a oxynitride layer employed as a gate insulating layer of the MOS transistor according to the embodiment of the present invention, wherein an ordinate is represented by a logarithmic scale and an abscissa is represented by a proportional scale.

The nitrogen concentration is changed from a surface of the silicon substrate to about 3 nm upward, i.e. the depth of 3~6 nm of the first silicon oxynitride layer as shown in FIG.4, at a rate of less than $1 \times 10^3$ c/nm.

Figure 5A:
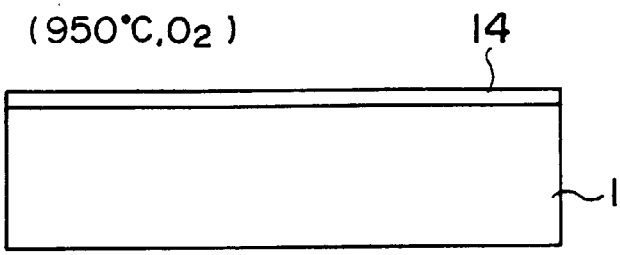
FIGS. 5A to 5D are sectional views showing steps of forming a gate insulating layer and a source/drain region covering insulating layer of the MOS transistor.
Figure 5B:
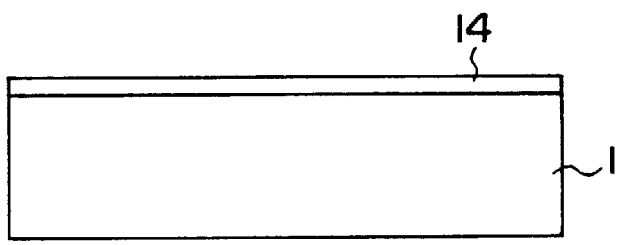
Figure 5C:
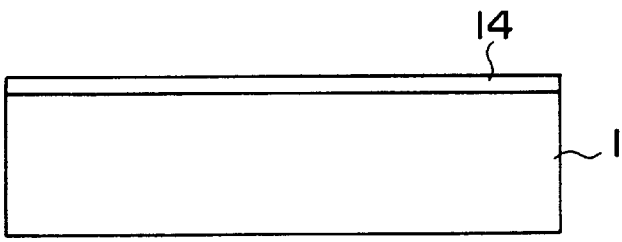
Figure 5D:
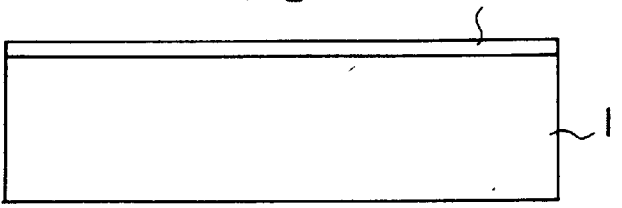

(ii) Then, the insulating layer 14 made of oxide silicon of about 5.3 nm thickness is formed by the vertical diffusion furnace in the diluted oxygen atmosphere (FIG. 5A). The insulating layer 14 is then changed into the silicon oxynitride layer by exposing the insulating layer 14 to the $NH_3$ gas containing atmosphere by virtue of the rapid thermal annealing apparatus (FIG. 5B). The $NH_3$ gas in the furnace of the rapid thermal annealing apparatus is then replace with the $N_2$ gas (FIG. 5C). After the $NO_2$ gas is introduced into the furnace, the silicon oxynitride silicon is then exposed to the atmosphere at 900° C. for 60 seconds to remove hydrogen in the insulating layer 14 (FIG. 5D). The resultant insulating layer 14 made of the silicon oxynitride is then analyzed by the SIMS. According to the SIMS analysis, analysis results shown in FIGS. 6 to 8 have been obtained.

Figure 6:
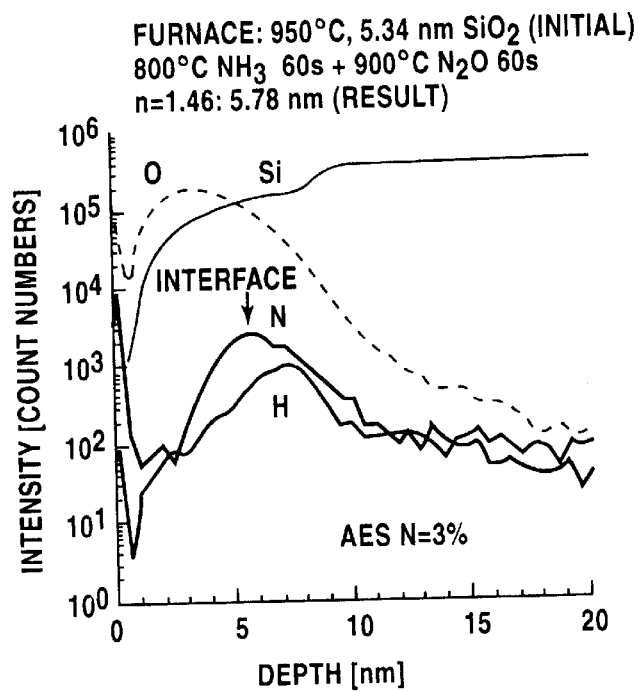
FIG. 6 is a graph showing concentration distribution of constituent elements included in a first oxynitride layer covering source/drain regions of the MOS transistor according to the embodiment of the present invention, wherein an ordinate is represented by a logarithmic scale and an abscissa is represented by a proportional scale.
Figure 7:
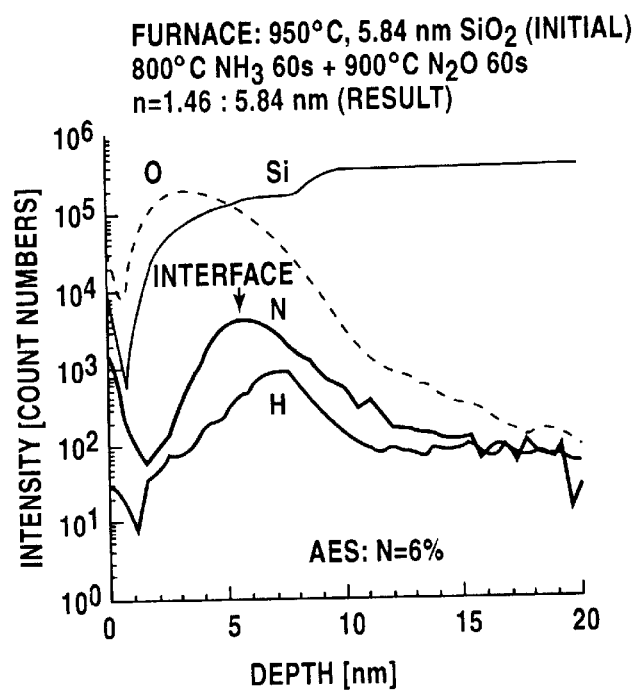
FIG. 7 is a graph showing concentration distribution of constituent elements included in a second oxynitride layer covering source/drain regions of the MOS transistor according to the embodiment of the present invention, wherein an ordinate is represented by a logarithmic scale and an abscissa is represented by a proportional scale.
Figure 8:
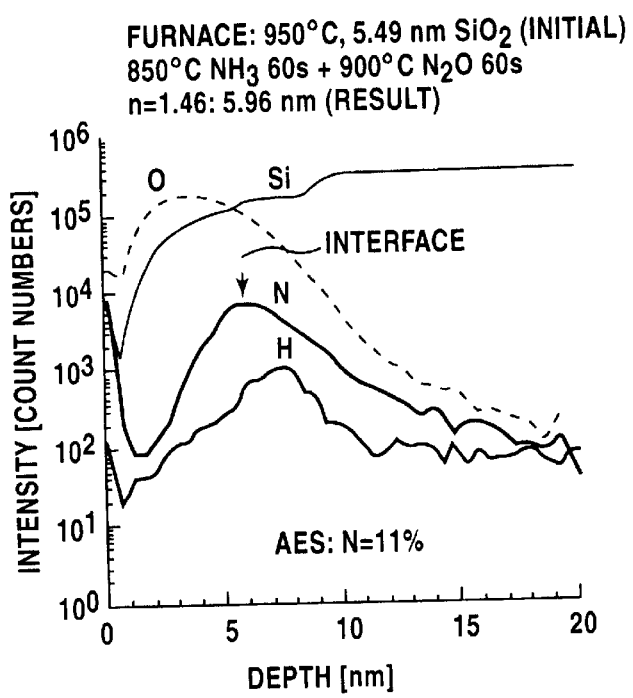
FIG. 8 is a graph showing concentration distribution of constituent elements included in a third oxynitride layer covering source/drain regions of the MOS transistor according to the embodiment of the present invention, wherein an ordinate is represented by a logarithmic scale and an abscissa is represented by a proportional scale.

FIGS. 6 to 8 shows differences respectively when the temperature is varied to 750° C., 800° C., 850° C. upon exposing the $SiO_2$ insulating layer 14 to the $NH_3$ gas containing atmosphere.

The silicon oxynitride insulating layer 14, if analyzed by SIMS, is characterized in that change of nitride concentration distribution in the layer thickness direction becomes large rather than FIG. 4 and that a sharp peak appears on the interface between the silicon substrate 1 and the silicon oxynitride insulating layer 14. In addition, it has been deduced that, if the temperature of the $NH_3$ gas atmosphere is made higher, nitrogen concentration in the interface becomes larger since a nitrogen containing amount is increased.

In FIG. 4 and FIGS. 6 to 8, the insulating layer 14 exists in a range from a depth of 0 nm to the interface and a range which is deeper than the interface shows the silicon substrate 1.

(iii) Next, it will be explained in detail based on the experimental results what influence is exerted upon the MOS transistor by differences in the nitrogen distribution in the first and second silicon oxynitride layers 4, 4a.

It has been examined how the threshold voltage of the p-type MOS transistor is affected by the nitride concentration and its distribution in the silicon oxynitride layer and also how prevention of the punch-through of boron ion implantation into the substrate beneath the gate electrode is affected by nitride concentration and its distribution in the silicon oxynitride layer. In this examination, the silicon oxide layer not-containing nitrogen, which is commonly employed as the gate insulating layer, is included in comparison objects.

Six kinds of gate insulating layers of plural P-type MOS transistors employed in the examination are used according to difference in the film forming conditions.

The gate insulating layer of the first MOS transistor is made of a 6 nm thick silicon oxynitride layer which is formed in the $N_2O$ gas containing atmosphere at 950° C. in the vertical diffusion furnace. The nitrogen concentration distribution of the silicon oxynitride layer is shown in FIG. 4.

The gate insulating layer of the second MOS transistor is made of a silicon oxide layer which does not includes nitrogen and is formed on the surface of the silicon substrate in the diluted oxygen atmosphere in the vertical diffusion furnace.

The gate insulating layer of the third MOS transistor is made of the silicon oxynitride layer which can be formed by exposing the silicon oxide ($SiO_2$) layer of 5 nm thickness formed on the surface of the silicon substrate to the $N_2O$ gas containing atmosphere in the furnace of the rapid thermal annealing apparatus at 1000° C. for 60 seconds to thus change the silicon oxide layer into the silicon oxynitride layer. In this case, a thickness of the silicon oxynitride layer is increased up to 6 nm according to chemical combination of nitrogen and silicon.

The gate insulating layer of the fourth MOS transistor is made of a layer which can be formed by exposing the 5.3 nm thick silicon oxide layer on the surface of the silicon substrate to the $NH_3$ gas containing atmosphere at 750° C. in the furnace of the rapid thermal annealing apparatus, then replacing the gas in the atmosphere with $N_2$, and then exposing the silicon oxynitride layer to the $N_2O$ gas atmosphere at 900° C. In this case, a thickness of the finally formed silicon oxynitride layer is increased up to 6 nm according to chemical combination of nitrogen and silicon. The nitrogen concentration distribution of the silicon oxynitride layer is substantially like that shown in FIG. 6.

The gate insulating layer of the fifth MOS transistor is made of a 6 nm thick silicon oxynitride layer which can be obtained by exposing the 5.3 nm thick silicon oxide layer on the surface of the silicon substrate to the $NH_3$ gas containing atmosphere at 800° C. in the furnace of the rapid thermal annealing apparatus, and then exposing the silicon oxide layer sequentially to the $N_2$ gas and the $N_2O$ gas under the same conditions as those in manufacturing the gate insulating layer of the fourth MOS transistor. The nitrogen concentration distribution of the silicon oxynitride layer is like that shown in FIG. 7.

The gate insulating layer of the sixth MOS transistor is made of a 6 nm thick silicon oxynitride layer which can be obtained by exposing the 5.3 nm thick silicon oxide layer on the surface of the silicon substrate to the $NH_3$ gas containing atmosphere at 850° C. in the furnace of the rapid thermal annealing apparatus, and then exposing the silicon oxide layer sequentially to the $N_2$ gas and the $N_2O$ gas under the same conditions as those in manufacturing the gate insulating layer of the fourth MOS transistor. The nitrogen concentration distribution of the silicon oxynitride layer is like that shown in FIG. 8.

Then the first to sixth MOS transistors are formed via steps of forming the gate insulating layer described above, then forming the gate electrode, and then ion-implanting borons into the silicon substrate. The threshold voltages of the first to sixth MOS transistors are then measured. At that time, two type of ion implantation, i.e., boron ion ($B_+$) and boron fluoride ion ($B_2^+$) implantation has been carried out.

Ion implantation condition of $B_+$ (referred to as first implantation condition hereinafter) is selected to the condition that boron ion does not punch through the pure silicon oxide layer of 6 nm thickness formed beneath the gate electrode, and therefore an accelerating energy is set to 9 keV and a dose is set to $2 \times 10^{15}$ atoms/$cm^2$. That is to say, such condition is that, when $B_+$ is ion-implanted in the step of forming the second MOS transistor, such impurity does not reach the silicon substrate beneath the gate electrode.

Ion implantation condition of BF, (referred to as second implantation condition hereinafter) is selected to the condition that boron ion punch through the pure silicon oxide layer of 6 nm thickness formed beneath the gate electrode, and therefore an accelerating energy is set to 30 keV and a dose is set to $2 \times 10^{15}$ atoms/$cm^2$. In other words, such condition is that, when $BF_2^+$ is ion-implanted in the step of forming the second MOS transistor, such impurity enter into the silicon substrate beneath the gate electrode.

In the first to sixth MOS transistors employed in the experiment, gate lengths (lengths in the source-drain direction) of the gate slectrode are 0.5 $\mu$m respectively, gate widths (widths in the direction intersecting orthogonally to the gate lengths) of the gate electrode are 5 $\mu$m respectively, and gate film thicknesses of the gate electrode are 180 nm respectively. At that time, an applied voltage to the gate electrodes is turned ON and OFF in the range from 0.5 V to −2.5 V, and a drain voltage is set to −2.5 V. In addition, the threshold voltage is measured at 200 points of location in the in-plane and then an average of the threshold voltage is calculated.

Figures 9A, 9B:
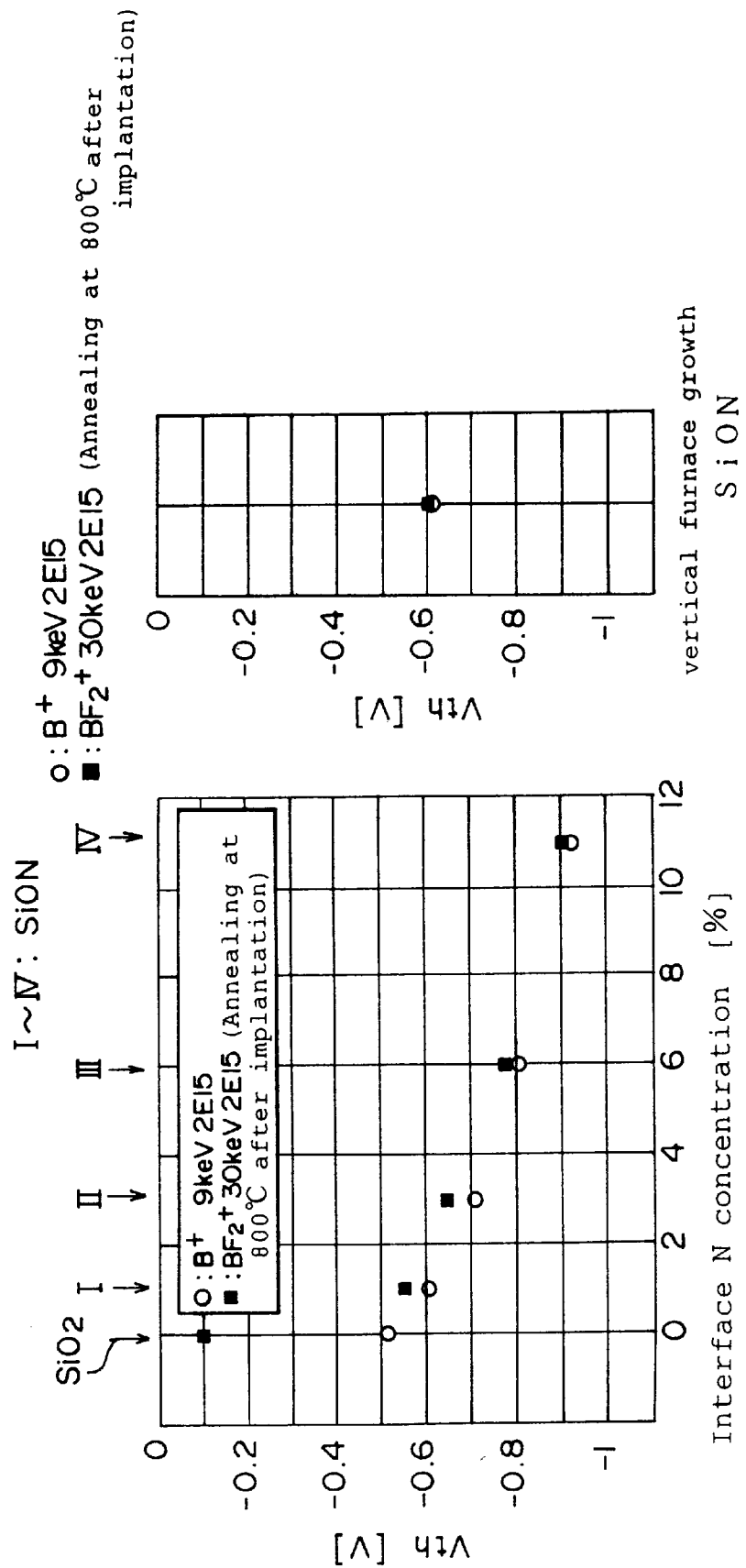
FIG. 9A is a characteristic view showing variation in the threshold value of the MOS transistor after borons are ion-implanted into an $SiO_2$ layer and four kinds SiON layers, in which nitrogens are segregated, respectively with changing injection conditions, wherein an ordinate and an abscissa are represented by a proportional scale.
FIG. 9B is a characteristic view showing variation in the threshold value of the MOS transistor after borons are ion-implanted into the SiON layers, in which nitrogens are distributed broadly in the film thickness direction, with changing injection conditions, wherein an ordinate and an abscissa are represented by a proportional scale.

The results shown in FIGS. 9A and 9B have been derived from the above experiment. In FIGS. 9A and 9B, the silicon substrate has been heated at a temperature of 800° C. for 60 minutes after $BF_2^+$ is ion-implanted in the second implantation condition. This is because thermally diffusion of boron makes easy the punch-through of boron via the gate insulating layer.

It is of course that, if the gate insulating layer is composed of the pure silicon oxide, variation in the threshold value of the gate voltage depending upon nitrogen does not occur. Therefore, with regard to the second MOS transistor using the pure silicon oxide layer as the gate insulating layer, if influences of the first implantation condition and the second implantation condition on the threshold voltage Vth is checked, the threshold voltage Vth has been shifted to the plus side by 0.4 V under the second implantation condition rather than the first implantation condition, as shown by the nitrogen concentration 0 on the interface in FIG. 9A. That is to say, it can be seen that difference of 0.4 V in the threshold voltage occurs because of the punch-through of boron ion via the gate electrode and the gate insulating layer.

On the contrary, if nitrogen is included in the gate insulating layer and further the nitrogen concentration is gradually changed or is made substantially uniform from the surface of the silicon substrate 1 to the inside along the film thickness direction, as in the gate insulating layer of the first MOS transistor, the threshold voltages Vth are not changed not to cause their difference under both the first implantation condition and the second implantation condition, as shown in FIG. 9B. In other words, such equal results obtained under both the first implantation condition and the second implantation condition would signify that boron does not punch through the gate insulating layer under the second implantation condition.

When the third to sixth MOS transistors in which a peak of the nitrogen concentration resides in the interface between the gate insulating layer and the substrate are compared, it has been found that, as the nitrogen concentration in the silicon oxynitride layer constituting the gate insulating layer is increased, the threshold voltage has been shifted to the minus side under the first implantation condition, as shown by I to IV in FIG. 9A. Further, when the third to sixth MOS transistors are compared, the threshold voltages have also been shifted to the minus side under the second implantation condition, as in the first implantation condition, with the increase of the nitrogen concentration in the silicon oxynitride layer constituting the gate insulating layer, as shown by I to IV in FIG. 9A, but the threshold voltages have been shifted respectively to the plus side rather than the first implantation condition. The reason why the threshold voltages have been shifted to the plus side is that boron ions punch through the gate insulating layer to enter into the silicon substrate.

Moreover, when nitrogen of considerably high concentration is introduced such that the nitrogen concentration on the boundary between the silicon substrate and the silicon oxynitride layer exceeds 10%, the threshold voltages Vth of the MOS transistors treated respectively under the first implantation condition and the second implantation condition coincide substantially with each other. This appears in the sixth MOS transistor. A coincidence of the threshold voltages Vth would signify that the punch-through of boron in the oxynitride silicon layer can be prevented.

On the contrary, in the first MOS transistor, as shown in FIG. 9B, the identical threshold voltages Vth can be achieved even if borons are ion-implanted under either the first implantation condition or the second implantation condition. The threshold voltage Vth of the MOS transistor which is ion-implanted under the first implantation condition becomes identical to that in the case where the interface nitrogen concentration is set to 2% in FIG. 9A. In addition, such threshold voltage Vth has been slightly shifted to the minus side by about 0.1 V in contrast to the threshold voltage of the second MOS transistor which has the gate insulating layer made of the pure silicon oxide. It may be considered that such shift is caused by nitrogen included in the gate insulating layer.

In this manner, in the silicon oxynitride layer in which the nitrogen concentration is gradually changed in the layer thickness direction, otherwise the nitrogen concentration is hardly changed in the layer thickness direction, the punch-through of the impurity ion can be prevented and further variation in the threshold voltage can be suppressed. Besides, the nitrogen in-plane distribution in the silicon nitrogen oxide layer becomes substantially uniform. Since such effects can be brought about even though the nitrogen concentration in the interface between the silicon oxynitride layer and the silicon substrate is low, the number of carrier trapped by nitrogen becomes less so that variation in the transistor parameters can be suppressed.

On the other hand, as shown in the first example and the second example, since the peak of nitrogen concentration distribution exists in the interface between the silicon oxynitride layer and the silicon substrate in the source/drain regions, the nitrogen concentration in the silicon oxynitride is sufficient to block hot carriers between the gate electrode and the source/drain regions. In addition, since the threshold value of the gate voltage is scarcely varied even if the peak is made higher, the hot carrier resistance can be still further improved by increasing the peak of nitrogen concentration. In this case, a profile of the nitrogen concentration in the silicon oxynitride layer can be given as shown in FIG. 6, FIG. 7 or FIG. 8. The method shown in FIGS. 5A to 5D may be adopted as the method of forming the silicon oxynitride layer having such profile in addition to the first example and the second example.

Therefore, according to the MOS transistor which is formed via the steps explained in the above first and second examples, the punch-through of the impurity ion can be prevented by the gate insulating layer formed beneath the gate electrode and the hot carrier resistance can be enhanced by the insulating layers formed on the side surfaces of the gate electrode.

Figure 10:
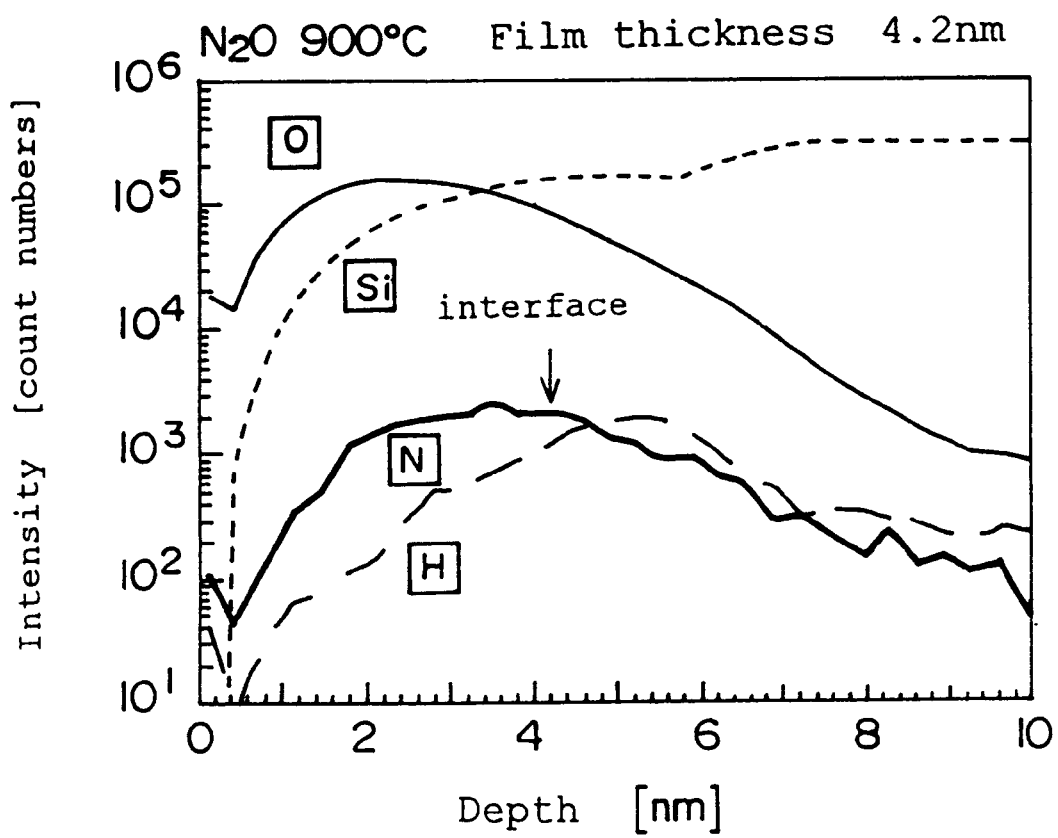
FIG. 10 is a graph showing concentration distribution of constituent elements included in a 4.3 nm thick oxynitride layer employed as a gate insulating layer of the MOS transistor according to the embodiment of the present invention, wherein an ordinate is represented by a logarithmic scale and an abscissa is represented by a proportional scale.

In the above explanation, although the gate insulating layers of 6 nm thickness have been discussed, a ultra thin gate insulating layer employed in the next generation semiconductor device is also available. For instance, with respect to the 4.2 nm thick silicon oxynitride layer, the nitrogen concentration distribution can be controlled by exposing the silicon substrate to the $N_2O$ gas containing atmosphere at 900° C. in the vertical diffusion furnace such that the nitrogen concentration is gradually changed along the film thickness direction in the layer or the nitrogen concentration is not changed along the film thickness direction in the layer. For example, element distribution in the oxynitride silicon has been derived as shown in FIG. 10. The magnitudes of nitrogen concentrations shown in FIG. 10 and FIG. 5 to FIG. 8 have been detected from intensity of the results of SIMS analysis after drawing a calibration curve based on the values obtained according to the Auger analysis.

In case the gate insulating layer beneath the gate electrode is formed by the oxynitride insulating material, the peak of the nitrogen concentration may be positioned in the interface between the gate electrode and the gate insulating layer.

Figure 11A:
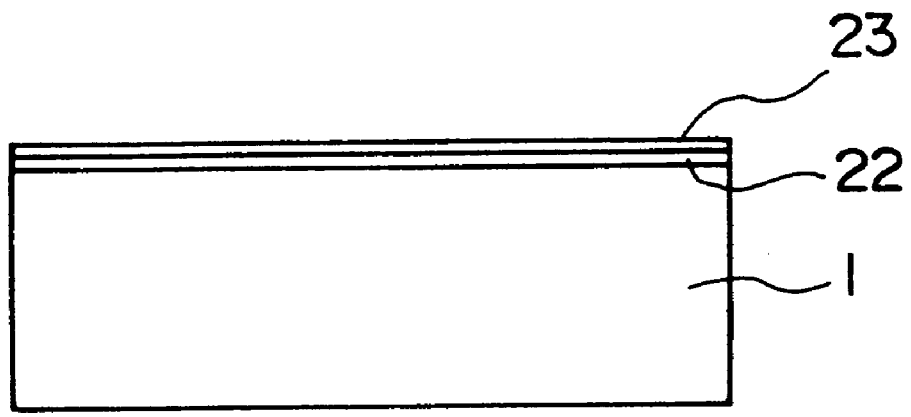
FIG. 11A and 11B illustrate the case of a gate insulating layer being formed beneath a gate electrode by an oxide nitride insulating material.
Figure 11B:
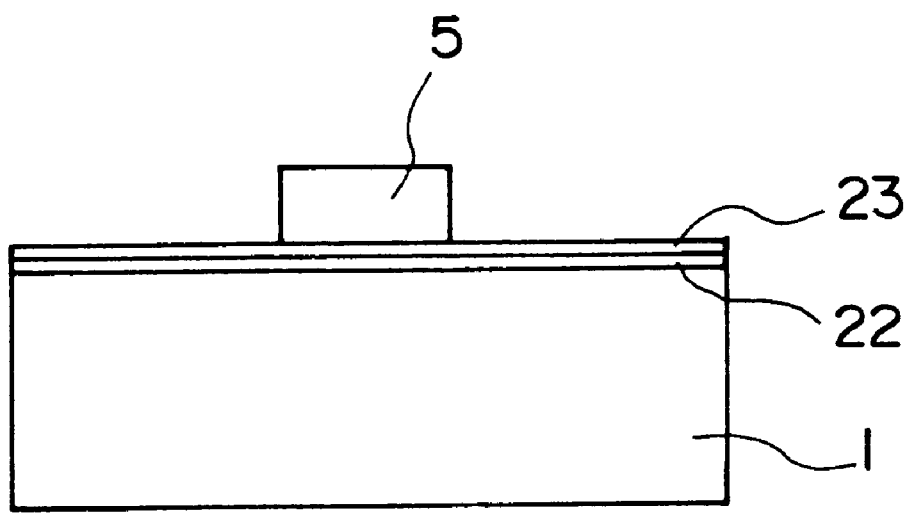

For example, as shown in FIG. 11A, a $SiO_2$ layer 22 having a thickness of 40 nm is formed on the silicon substrate 1 by the progenic oxidation method at 800° C. using $H_2$ and $O_2$ gases, thereafter a SiN layer 23 having a thickness of 30 nm is formed on the $SiO_2$ layer 22 by the CVD method using $NH_3$ and $H_2SiCl_2$ gases at 625° C. The $SiO_2$ and SiON layer 22, 23 are used as a gate insulating layer. On the gate insulating layer, a gate electrode 5 is formed by according to the above method, as shown in FIG. 11B.

In the above explanation, although boron has been employed as impurity, other p-type impurity or n-type impurity such as arsenic, phosphorus, etc. may be employed.

Furthermore, in addition to the above embodiments, the gate insulating layer beneath the gate electrode may be formed of the silicon oxynitride to change gradually the nitrogen concentration distribution along the film thickness direction or to change scarcely the nitrogen concentration distribution along the film thickness direction, and the insulating layer made of pure silicon oxide may be formed on the surface of the source/drain regions. As the step of forming the insulating layer made of silicon oxide, there is a method wherein the gate electrode is formed as shown in FIG. 2B, then the silicon oxynitride layer located on both sides of the gate electrode is removed, and then the surface of the silicon substrate located in regions from which the silicon oxynitride layer is removed is re-oxidized. It is preferable that this structure is adapted for a device wherein, by adjusting parameters such as impurity concentration in the drain region, gate length, etc., the hot carrier effect should be decreased and prevention of the degradation of the breakdown voltage in the peripheral portion of the gate electrode should be improved or the film thickness should be stabilized. As an example of the device in which the film thickness should be stabilized, there exists a case where a depth of impurity which are ion-implanted should be stabilized upon forming the shallow impurity diffusion layer having the LDD structure.

If the silicon oxynitride layer is removed from both sides of the gate electrode, there is a method wherein the silicon oxynitride layer even slightly remains and then the surface of the silicon substrate is oxidized. In this event, since nitrogen though being slightly is included, the hot carrier resistance can be somewhat expected. According to such step, damage and etching of the substrate can be prevented because the surface of the silicon substrate is not exposed.

Various modifications will become possible for those skilled in the art after receiving the teachings of the present disclosure without departing from the scope thereof.

What is claimed is:

1. A semiconductor device comprising:
a gate insulating layer made of oxynitride formed on a semiconductor substrate;
a gate electrode formed on said gate insulating layer;
source/drain regions formed in said semiconductor substrate on both sides of said gate electrode and including impurity; and
an oxynitride insulating layer covering said source/drain regions on a surface of said semiconductor substrate and having nitrogen concentration distribution which is different from that of said gate insulating layer along a film thickness direction.

2. A semiconductor device according to claim 1, wherein said semiconductor substrate is formed of a silicon substrate, said gate insulating layer is formed of a first silicon oxynitride layer, and said oxynitride insulating layer is formed of a second silicon oxynitride layer differed from said first silicon oxynitride layer.

3. A semiconductor device according to claim 1, wherein said nitrogen concentration of said oxynitride insulating layer is segregated in an interface between said semiconductor substrate and said oxynitride insulating layer.

4. A semiconductor device according to claim 1, wherein nitrogen concentration distribution in said gate insulating layer is gradually changed along a layer thickness direction or is made substantially uniform along said layer thickness direction, without being segregated in an interface between said semiconductor substrate and said oxynitride insulating layer.

5. A semiconductor device according to claim 1, wherein nitrogens in said gate insulating layer are segregated in an interface between said gate electrode and said gate insulating layer.

6. A semiconductor device according to claim 1, wherein nitrogen concentration in said gate insulating layer is changed from an interface of said semiconductor substrate and said gate insulating layer to the inward of said gate insulating layer at a rate of less than $1 \times 10^3$ c/nm.

7. A semiconductor device comprising:
a gate insulating layer formed on a semiconductor substrate and formed of an oxynitride in which nitrogen concentration is made substantially uniform along a layer thickness direction from an interface between said oxynitride and said semiconductor substrate to at least 50 percent thickness of said oxynitride;
a gate electrode formed on said gate insulating layer;
source/drain regions formed in said semiconductor substrate on both sides of said gate electrode; and
an insulating layer covering said source/drain regions on a surface of said semiconductor substrate.

8. A semiconductor device according to claim 7, wherein said semiconductor substrate is formed of a silicon substrate, said oxynitride is formed of a silicon nitride oxide, and said insulating layer is formed of a silicon oxide.

* * * * *